(12) United States Patent
Park et al.

(10) Patent No.: US 12,295,095 B2
(45) Date of Patent: May 6, 2025

(54) PRINTED CIRCUIT BOARD AND STORAGE DEVICE INCLUDING THE SAME

(71) Applicant: Samsung Electronics Co., Ltd., Suwon-si (KR)

(72) Inventors: Sunhong Park, Sejong-si (KR); Hyunjong Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 498 days.

(21) Appl. No.: 17/734,462

(22) Filed: May 2, 2022

(65) Prior Publication Data

US 2023/0014935 A1 Jan. 19, 2023

(30) Foreign Application Priority Data

Jul. 13, 2021 (KR) .................. 10-2021-0091681

(51) Int. Cl.
*H05K 1/02* (2006.01)
*H05K 1/11* (2006.01)
*H05K 3/46* (2006.01)

(52) U.S. Cl.
CPC ......... *H05K 1/0268* (2013.01); *H05K 1/0298* (2013.01); *H05K 1/115* (2013.01);
(Continued)

(58) Field of Classification Search
CPC .... H05K 1/0268; H05K 1/0298; H05K 1/115; H05K 2201/0338; H05K 2201/096;
(Continued)

(56) References Cited

U.S. PATENT DOCUMENTS 4,985,675 A * 1/1991 Turudic ............. G01R 31/2805
324/763.01
5,266,380 A * 11/1993 Renguso ............. H05K 3/4638
428/209
(Continued)

FOREIGN PATENT DOCUMENTS

| KR | 100532850 B1 | 12/2005 |
| KR | 100791945 B1 | 1/2008 |
| KR | 101733076 B1 | 5/2017 |

*Primary Examiner* — Steven T Sawyer
(74) *Attorney, Agent, or Firm* — Harness, Dickey & Pierce, P.L.C.

(57) ABSTRACT

A printed circuit board, in which two or more copper clad laminates (CCLs) are laminated vertically from an uppermost circuit layer to a lowermost circuit layer, includes a non-destructive testing area, mislamination identifying portions in the non-destructive testing area, the mislamination identifying portions being in the CCLs, respectively, through-via holes vertically exposing the mislamination identifying portions, respectively, in the non-destructive testing area, the through-via holes being spaced apart from each other by a first interval, and a probe via extending vertically and being in contact with an end portion of each of the mislamination identifying portions on a same side. A length of the mislamination identifying portion in an N-th (N is an integer of 1 to K) layer CCL in a horizontal direction is longer than a length of the mislamination identifying positioned in an (N−1)-th layer CCL in the horizontal direction.

12 Claims, 14 Drawing Sheets

(52) U.S. Cl.
CPC ......... *H05K 1/0269* (2013.01); *H05K 3/4638* (2013.01); *H05K 2201/0338* (2013.01); *H05K 2201/096* (2013.01); *H05K 2201/10159* (2013.01)

(58) Field of Classification Search
CPC ....... H05K 2201/10159; H05K 1/0269; H05K 3/4638; H05K 1/0266; H05K 2201/0979; H05K 2201/09918; G11C 2029/0403; G01R 1/07307; G01R 31/308
See application file for complete search history.

(56) References Cited

U.S. PATENT DOCUMENTS

| | | | |
|---|---|---|---|
| 6,091,026 A * | 7/2000 | Yang | H05K 3/4638 |
| | | | 174/250 |
| 6,114,634 A | 9/2000 | Dittmer | |
| 6,391,669 B1 * | 5/2002 | Fasano | H05K 3/4638 |
| | | | 438/18 |
| 6,662,441 B2 | 12/2003 | Janecek | |
| 7,583,513 B2 | 9/2009 | Boggs et al. | |
| 8,253,429 B2 | 8/2012 | Lee et al. | |
| 2006/0027920 A1 * | 2/2006 | Aramata | H05K 1/16 |
| | | | 257/735 |
| 2008/0204038 A1 * | 8/2008 | Fukami | G01R 31/2812 |
| | | | 174/250 |
| 2016/0037637 A1 | 2/2016 | Carlson et al. | |
| 2016/0143141 A1 * | 5/2016 | Ku | H05K 1/0268 |
| | | | 174/265 |

* cited by examiner

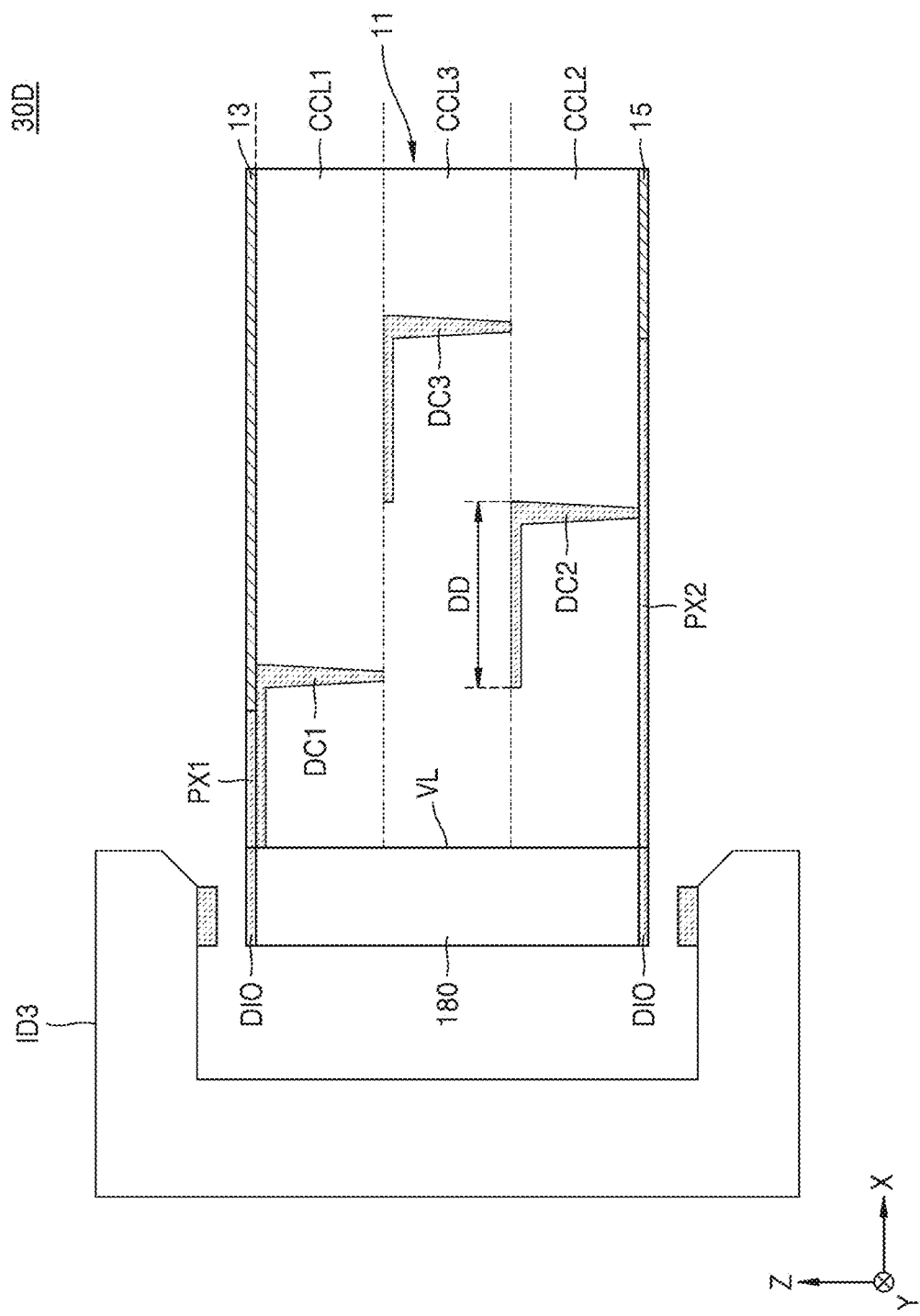

PRINTED CIRCUIT BOARD AND STORAGE DEVICE INCLUDING THE SAME

CROSS-REFERENCE TO RELATED APPLICATION

This application is based on and claims priority under 35 U.S.C. § 119 to Korean Patent Application No. 10-2021-0091681, filed on Jul. 13, 2021, in the Korean Intellectual Property Office, the disclosure of which is incorporated by reference herein in its entirety.

BACKGROUND

The inventive concepts relate to printed circuit boards (PCB) and/or storage devices including the same.

Flash memory is used as a storage device in various fields due to its advantages such as non-volatility, large capacity, and low noise. A storage device based on flash memory is referred to as a solid state drive (SSD). The SSD includes a plurality of semiconductor devices such as a controller and flash memory, and the semiconductor devices are mounted on a PCB to configure a semiconductor package. Detecting defects in PCBs in advance in storage devices such as SSDs and deriving appropriate solutions thereto is very important for product reliability.

SUMMARY

The inventive concepts provide printed circuit boards (PCB) enabling non-destructive testing, and/or storage devices including the same, to detect a mislamination defect of copper clad laminates (CCLs) that may occur during a manufacturing process of the PCB.

The problems to be solved by the inventive concepts are not limited to the problems mentioned above, and other problems not mentioned will be clearly understood by those skilled in the art from the following description.

According to an aspect of the inventive concepts, a printed circuit board in which K (K is an integer of 2 or greater) copper clad laminates (CCLs) are laminated vertically from an uppermost circuit layer (a first layer) to a lowermost circuit layer (a K-th layer), may include a non-destructive testing area, mislamination identifying portions in the non-destructive testing area, the mislamination identifying portions being in the CCLs, respectively, through-via holes vertically exposing the mislamination identifying portions, respectively, in the non-destructive testing area, the through-via holes being spaced apart from each other by a first interval, a probe via extending vertically and being in contact with an end portion of each of the mislamination identifying portions on a same side, wherein a length of the mislamination identifying portion in an N-th (N is an integer of 1 to K) layer CCL in a horizontal direction is longer than a length of the mislamination identifying portion in an (N−1)-th layer CCL in the horizontal direction, and (N−1) copper foil removed areas are arranged at the first interval in the mislamination identifying portion positioned in the N-th layer CCL.

According to another aspect of the inventive concepts, a printed circuit board in which K (K is an integer of 2 or greater) copper clad laminates (CCLs) are laminated vertically from an uppermost circuit layer (a first layer) to a lowermost circuit layer (a K-th layer), may include a non-destructive testing area in a dummy area of the printed circuit board, daisy chains in the CCLs, respectively, in the non-destructive testing area, each of the daisy chains including a horizontal extension portion extending in a horizontal direction by a first length on an upper surface of a corresponding one of the CCLs and a vertical extension portion extending in a vertical direction from an end of the horizontal extension portions through a corresponding one of the CCLs, and a reference line providing a reference position of the daisy chains in the non-destructive testing area and extending in the vertical direction, wherein the daisy chain positioned in the N-th (N is an integer of 1 to K)-layer CCL, from among the K CCLs, is apart from the reference line by (N−1) times the first length.

According to another aspect of the inventive concepts, a storage device may include a printed circuit board, at least one semiconductor package on the printed circuit board and including a plurality of nonvolatile memory chips, and a memory controller on the printed circuit board and configured to perform a write and read operation on the at least one semiconductor package, wherein the printed circuit board, in which a plurality of copper clad laminates (CCLs) are laminated vertically from an uppermost circuit layer to a lowermost circuit layer, includes mislamination identifying portions in a non-destructive testing area, the mislamination identifying portions being in the CCLs, respectively, in a non-destructive testing area, through-via holes vertically exposing the mislamination identifying portions, respectively, in the non-destructive testing area and the through-via holes being spaced apart from each other by a first interval, and a probe via extending vertically and being in contact with an end portion of each of the mislamination identifying portions on a same side, wherein, from the uppermost circuit layer to the lowermost circuit layer, lengths of the mislamination identifying portions gradually increase in a horizontal direction and the number of copper foil removed areas of the mislamination identifying portions gradually increases.

BRIEF DESCRIPTION OF THE DRAWINGS

Some example embodiments of the inventive concepts will be more clearly understood from the following detailed description taken in conjunction with the accompanying drawings in which:

FIGS. 6A to 6C are a plan view and cross-sectional views illustrating a PCB according to other example embodiments of the inventive concepts;

DETAILED DESCRIPTION

Hereinafter, some example embodiments of the inventive concepts will be described in detail with reference to the accompanying drawings.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
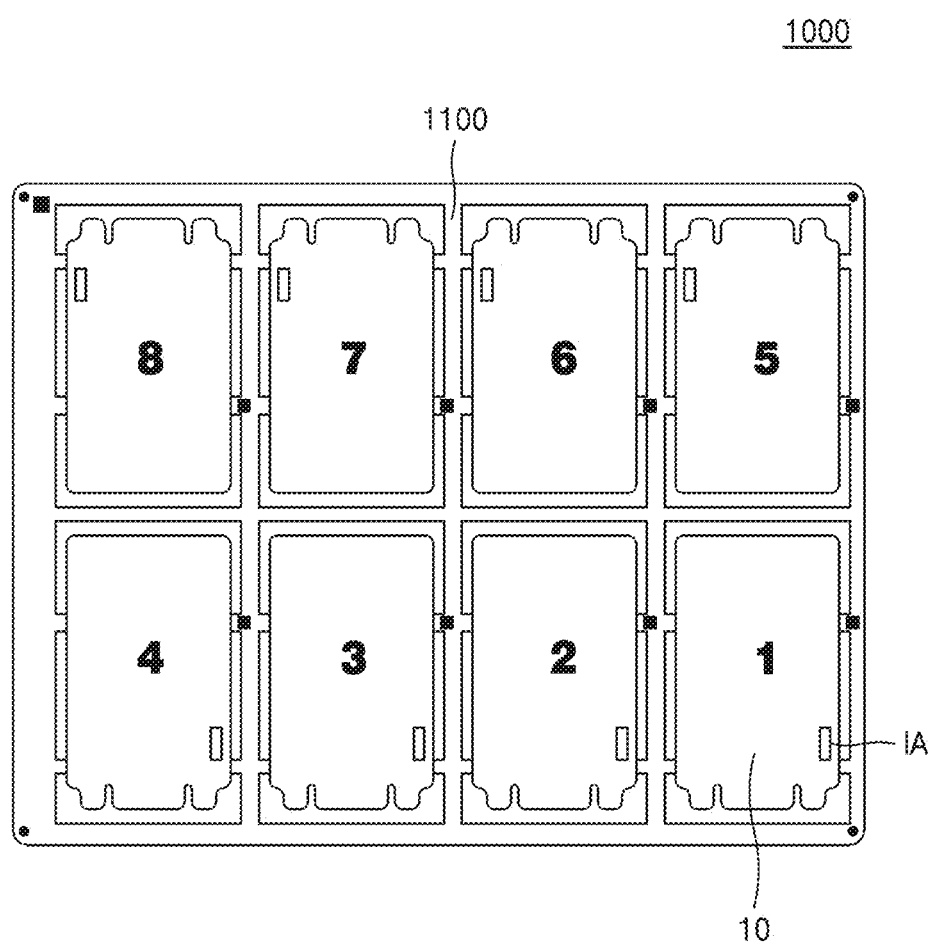
FIG. 1 is a plan view illustrating a support substrate including a printed circuit board (PCB) according to an example embodiment of the inventive concepts.

FIG. 1 is a plan view illustrating a support substrate 1000 including a printed circuit board (PCB) 10 according to an example embodiment of the inventive concepts.

Referring to FIG. 1, the support substrate 1000 in which a plurality of PCBs 10 are arranged in rows and columns is shown.

The support substrate 1000 includes the PCBs 10 and a support 1100 connecting and supporting the PCBs 10. Although the PCBs 10 are shown as having a form factor used in an M.2 type solid state drive (SSD) arranged in two rows, the number and arrangement of the PCBs 10 arranged in the support substrate 1000 are not limited thereto.

Each of the plurality of PCBs 10 may include a non-destructive testing area IA. Accordingly, when analyzing mislamination failure of copper clad laminates (CCLs) with respect to the PCBs 10, there is no need to separately connect the PCBs 10 to a test apparatus, thereby saving failure analysis time. In addition, after the analysis of mislamination failure of the CCLs is completed, when a portion connecting the PCBs 10 to the support 1100 is separated, each of the PCBs 10 may be provided, as the form factor used in the M.2 type SSD, to a storage device 100 (see FIG. 2).

Figure 2:
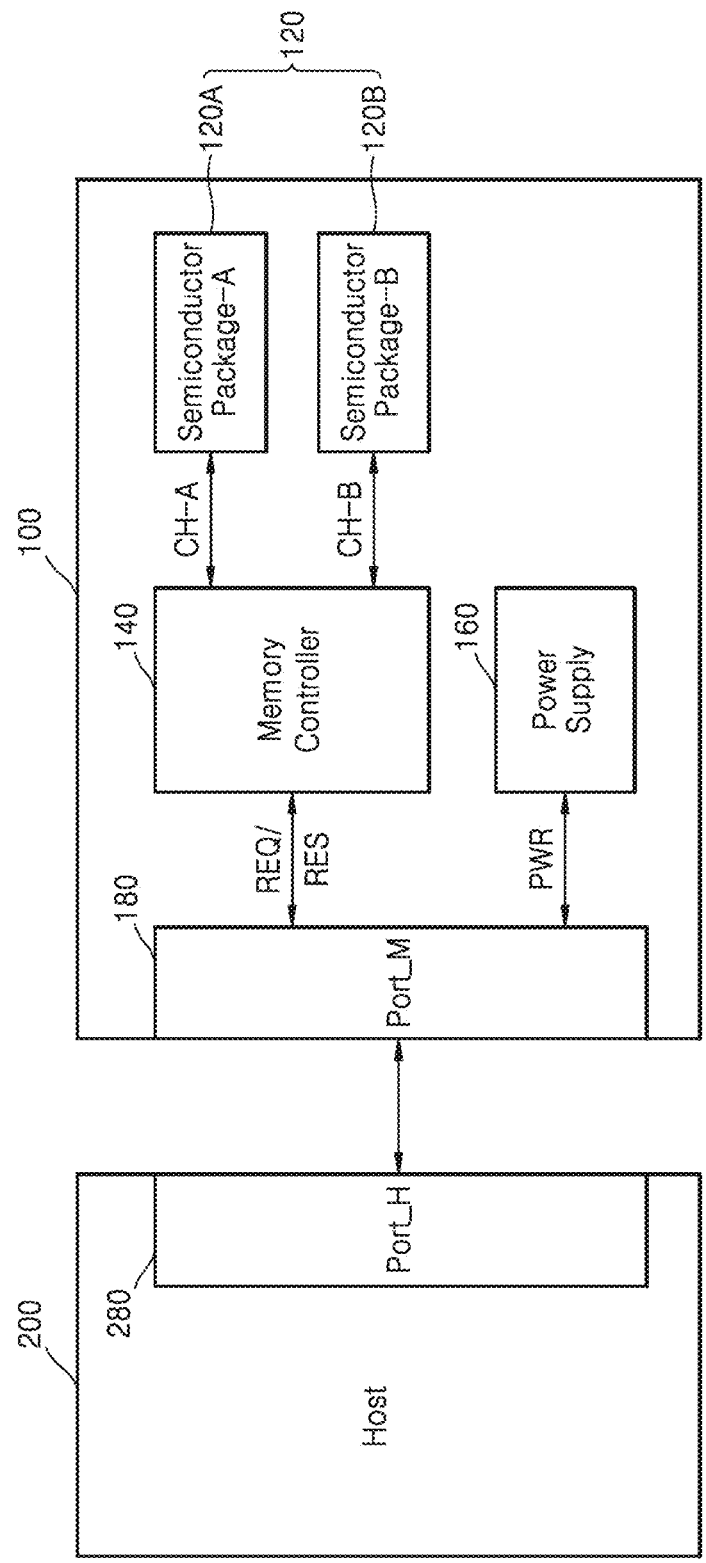
FIG. 2 is a block diagram illustrating a storage device according to an example embodiment of the inventive concepts.

FIG. 2 is a block diagram illustrating the storage device 100 according to an embodiment of the inventive concepts.

Referring to FIG. 2, the storage device 100 and a host 200 may communicate with each other, and the storage device 100 may include a semiconductor package 120, a memory controller 140, a power supply 160, and a port 180 (Port_M).

The semiconductor package 120 may include a plurality of memory chips each including a plurality of memory cells. In the present disclosure, the semiconductor package 120 refers to a package in which the memory chips are not provided as a package type but are provided as a chip scale type, and thus does not refer to only a general-type semiconductor package.

According to the technological development of a semiconductor package process, the memory chips may be mounted in the form of a chip scale rather than the form of a package on the PCB 10 (see FIG. 1). In an example embodiment, all the memory chips may be protected with a case or the like, or the memory chips may be directly encapsulated on the PCB 10 (see FIG. 1) using a polymer resin instead of a molding compound.

For example, the memory chips may be memory chips including a three-dimensional (3D) memory array. The 3D memory array may be formed in a monolithic manner on at least one physical level of a memory cell having an active region disposed on a silicon wafer and circuitry formed on or within the silicon wafer as circuitry related to an operation of the memory cell. The term 'monolithic' may refer to that layers of each level constituting a memory cell array are laminated directly on top of respective lower layers of the memory cell array.

In some example embodiments, the 3D memory array may include a vertical NAND string in which at least one memory cell is vertically positioned above another memory cell and auxiliary cells are positioned above or below the memory cells, in which at least one memory cell may include a charge trap layer.

In other example embodiments, the memory cells may be planar 2D horizontal NAND flash memory cells. In other example embodiments, the memory cells may be non-volatile memory cells such as resistive RAM (RRAM), phase change RAM (PRAM), or magnetic RAM (MRAM).

The memory cells included in the memory cell array may store data of 2 bits or more. In some example embodiments, the memory cells included in the memory cell array may be multi-level cells (MLCs) storing 2-bit data. In other example embodiments, the memory cells included in the memory cell array may be triple level cells (TLCs) storing 3-bit data. In still other example embodiments, the memory cells included in the memory cell array may store data of 4 bits or more. In some example embodiments, a memory cell included in a string of the memory cell array may be used as a single level cell (SLC) storing 1-bit data.

The memory chips constituting the semiconductor package 120 may be connected to the memory controller 140 through a channel group. For example, a semiconductor package A 120A may be connected to the memory controller 140 through a channel group CH-A, and a semiconductor package B 120B may be connected to the memory controller 140 through a channel group CH-B.

Although two semiconductor packages 120A and 120B and channel groups CH-A and CH—B are illustrated in the drawing, the inventive concepts are not limited thereto. The storage device 100 according to the inventive concepts may include one semiconductor package and one channel group or may include three or more semiconductor packages and three or more channel groups.

The memory controller 140 may receive a request REQ from the host 200 through the port 180 and may transmit a response RES to the host 200 through the port 180. For example, the memory controller 140 may receive a data read request from the host 200 through the port 180, and in response, the memory controller 140 may read data stored in a memory chip included in the semiconductor package 120 and transmit the read data to the host 200 through the port 180. The memory controller 140 may be configured as a semiconductor package or a chip scale type.

The power supply 160 may receive power PWR from the host 200 through the port 180, and based on the received power PWR, the power supply 160 may supply power PWR to components, for example, the semiconductor package 120 and the memory controller 140, included in the storage device 100.

The port 180 may include a plurality of pins, and the number, size, and arrangement of the pins may be determined based on an interface protocol for communicating with the host 200. The storage device 100 and the host 200 may communicate with each other through at least one of various interface protocols such as universal serial bus (USB), multi-media card (MMC), peripheral component interconnect-express (PCI-E), advanced technology attachment (ATA), serial-ATA, parallel-ATA, small computer system interface (SCSI), enhanced small device interface (ESDI), and integrated drive electronics (IDE), and the port 180 may include pins according to the interface protocols.

The storage device 100 may have various form factors to mount the semiconductor package 120 having various storage capacities. The storage device 100 may include a wiring board such as the PCB 10 (see FIG. 1), and the semiconductor package 120, the memory controller 140, and the power supply 160, which are components of the storage device 100, may be mounted on the PCB 10 (see FIG. 1). The PCB 10 (see FIG. 1) may include memory chip mounting regions apart from each other, and the semiconductor package 120 may be mounted in all or only some of the memory chip mounting regions depending on an environment in which the storage device 100 is used or depending on a desired memory capacity associated with an application, and thus the storage device 100 may be flexibly used.

Recently, in an environment in which the PCBs 10 (see FIG. 1) of various form factors are desired and manufactured, mislamination of CCLs constituting the PCBs 10 (see FIG. 1) may be particularly problematic. In order to solve the mislamination of the CCLs, an example embodiment of the inventive concepts proposes the PCB 10 (see FIG. 1) and the storage device 100 having a configuration for detecting a mislamination defect of CCLs through non-destructive testing. Details thereof are described below.

Figure 3A:
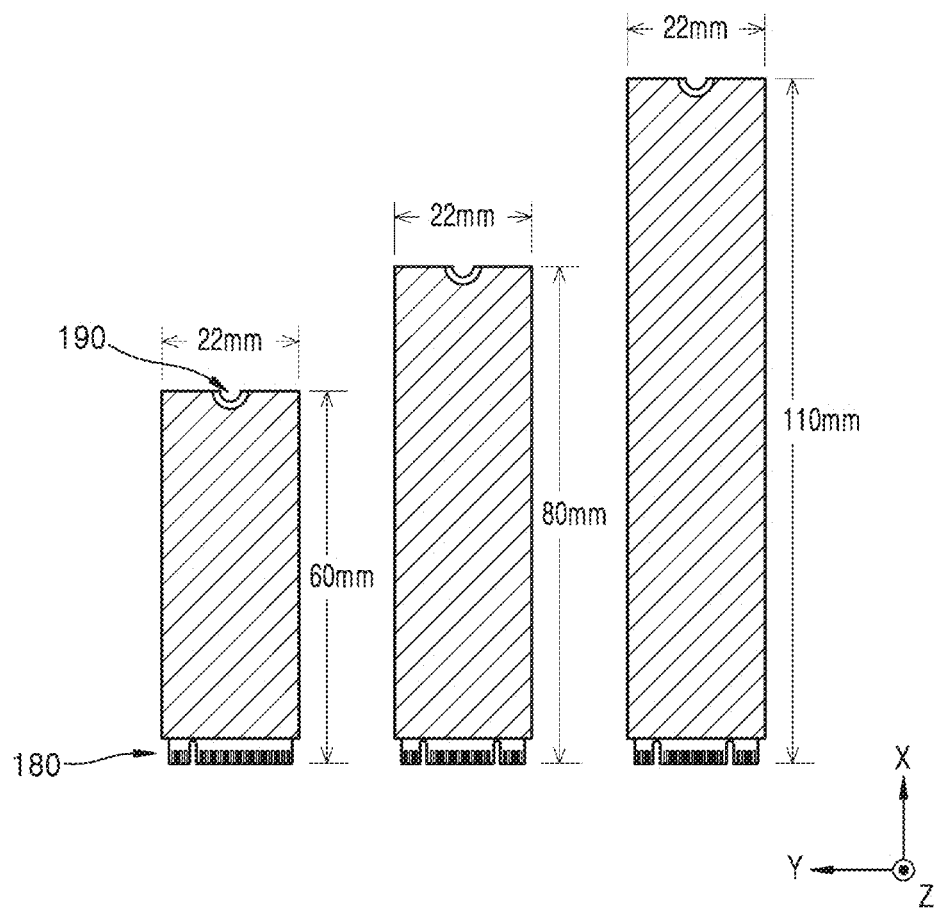
FIGS. 3A and 3B are diagrams illustrating examples of various form factors defining a PCB mounted on a storage device.
Figure 3B:
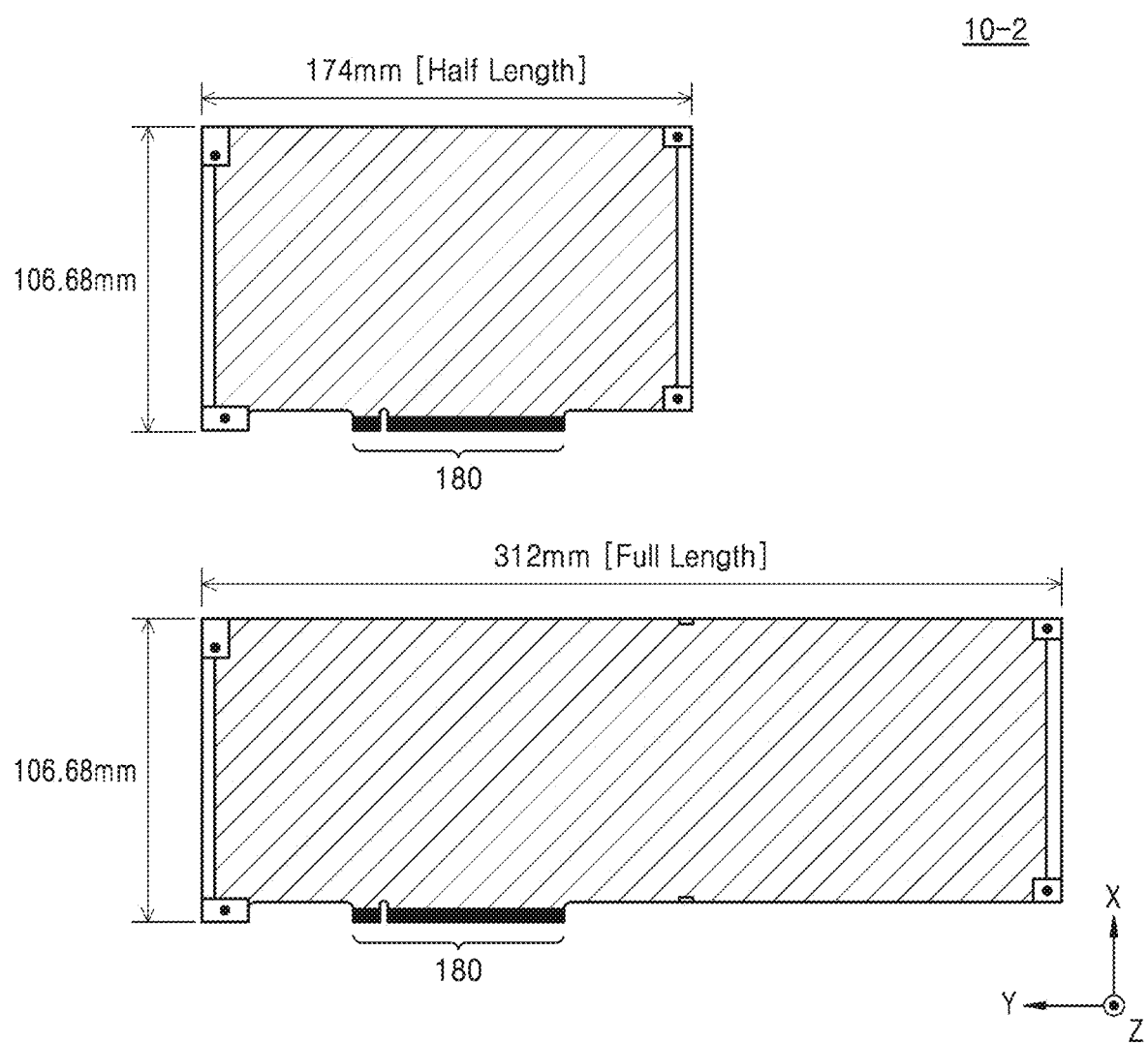

FIGS. 3A and 3B are views illustrating examples of various form factors defining PCBs mounted on a storage device.

In an example embodiment, FIG. 3A shows various sizes of a PCB 10-1 according to the M.2 standard, and FIG. 3B shows various sizes of a PCB 10-2 according to the PCI card standard.

Referring to FIG. 3A, as an example of a form factor, the M.2 standard may define thicknesses and horizontal widths of the PCB 10-1 constituting the storage device 100 (see FIG. 2).

The M.2 standard may define a length of the PCB 10-1 in an X direction as 60 mm, 80 mm, or 110 mm, and a length of the PCB 10-1 in a Y direction as 22 mm The M.2 standard may define the port 180. The port 180 may be positioned on one side of the PCB 10-1 and may include pins for communicating with the host 200 (see FIG. 2). The pins may be an exposed pattern, and the exposed pattern may be connected to a socket included in the host 200. The pins may include a conductive material, for example, a metal such as copper.

In addition, the M.2 standard may define a recessed structure 190 for mounting and fixing the storage device 100 (see FIG. 2) to the host 200 (see FIG. 2). Such a form factor may include the recessed structure 190 having a semicircular shape formed on the other side opposite to the port 180. The exposed pattern may be formed on the edge of the recessed structure 190, and may be connected to a conductor of the host 200 when mounted on the host 200. For example, a pattern formed on the edge of the recessed structure 190 may correspond to a ground node of the storage device 100, and when mounted on the host 200, the pattern may be connected to a conductor corresponding to a ground node of the host 200.

Referring to FIG. 3B, as an example of a form factor, the PCI card standard may define a length of the PCB 10-2 constituting the storage device 100 (see FIG. 2) in the X direction as 106.68 mm and a length of the PCB 10-2 in the Y direction as 174 mm or 312 mm The length in the Y direction defined by the PCI card standard defines a maximum length of the PCB 10-2, and the length of 174 mm in the Y direction may be referred to as a half length, and the length of 312 mm in the Y direction may be referred to as a full length. For example, when the PCB 10-2 has a half length, the PCB 10-2 may have a length of 106.68 mm in the X direction and a length of 174 mm or less in the Y direction. In the half length and the full length, the port 180 may have the same position and shape.

The PCBs 10-1 and 10-2 may be manufactured to have various form factors to accommodate semiconductor packages, according to the number of mounted semiconductor packages according to different specifications and memory capacities of various main boards included in various electronic devices.

Hereinafter, PCBs (10, 20, and 30, see FIGS. 4A to 6C) according to some example embodiments of the inventive concepts are described as conforming to the form factor according to the M.2 standard, but the inventive concepts are not limited thereto. FIGS. 3A and 3B show the M.2 standard and PCI card standard as examples for defining the form factor of the PCBs 10-1 and 10-2, but it may be understood that the inventive concepts may also be applied to other standards defining form factors corresponding to a plurality of sizes of PCBs.

Figure 4A:
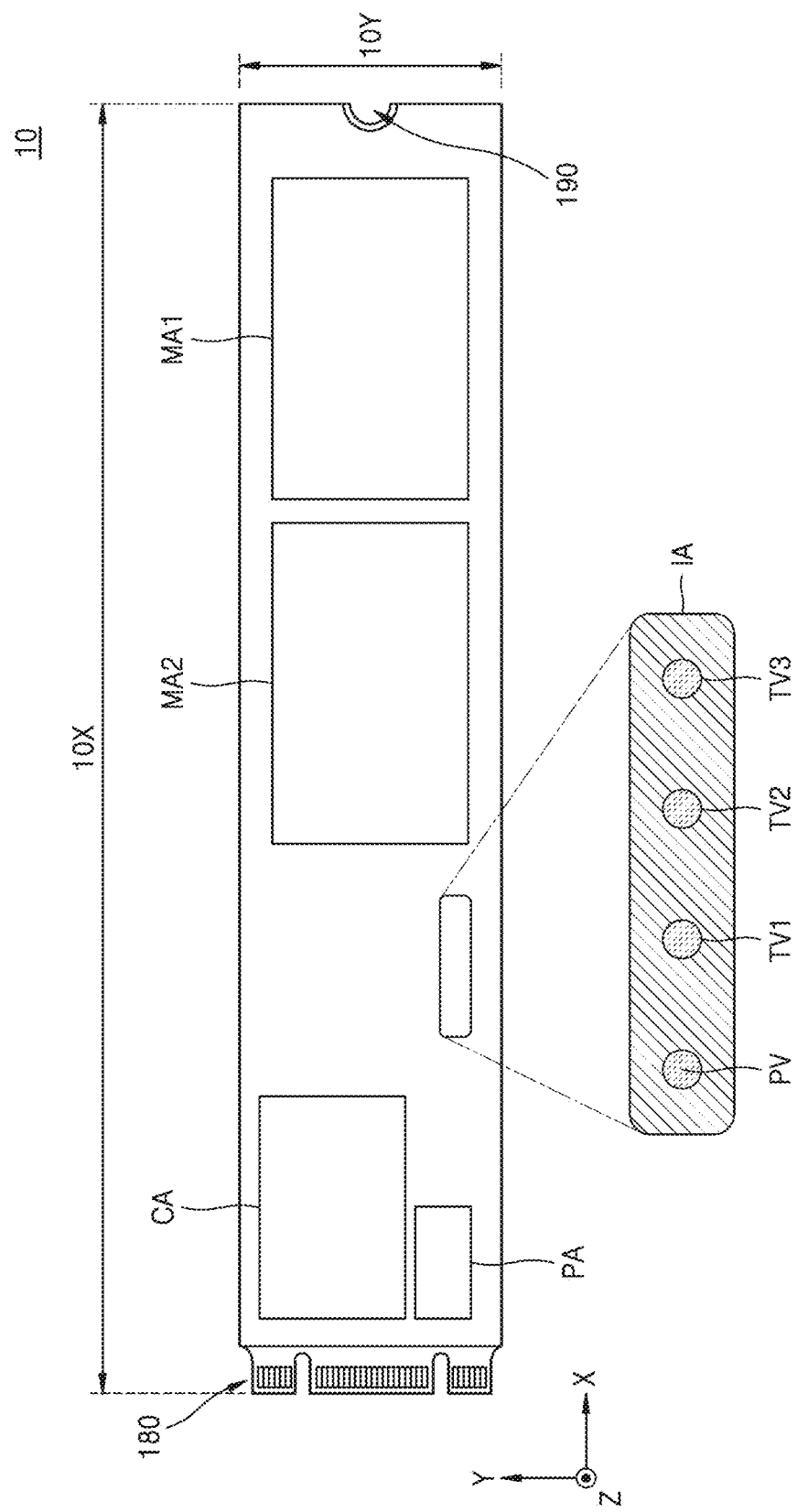
FIGS. 4A to 4C are a plan view and cross-sectional views illustrating PCBs according to an example embodiment of the inventive concepts.
Figure 4B:
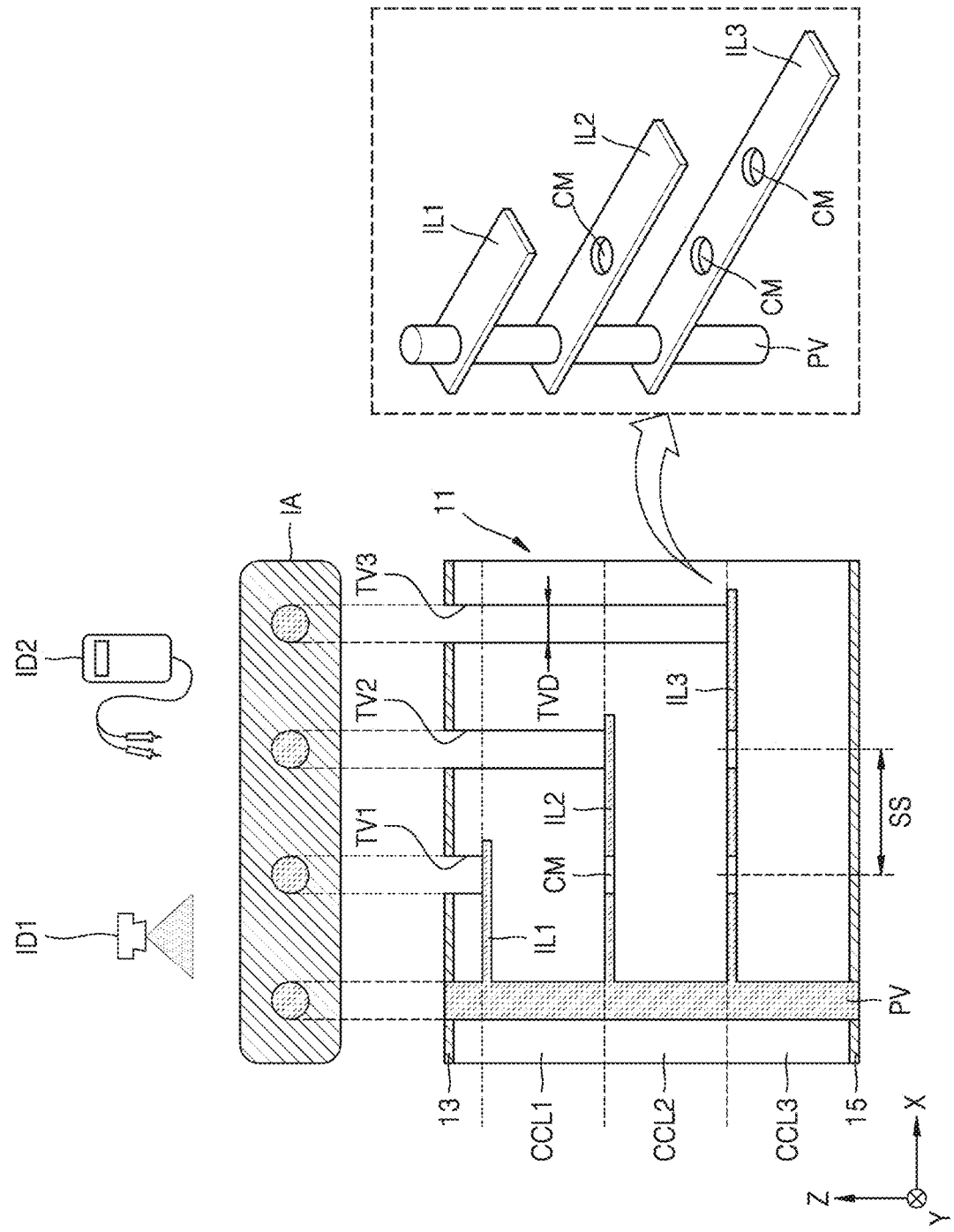
Figure 4C:
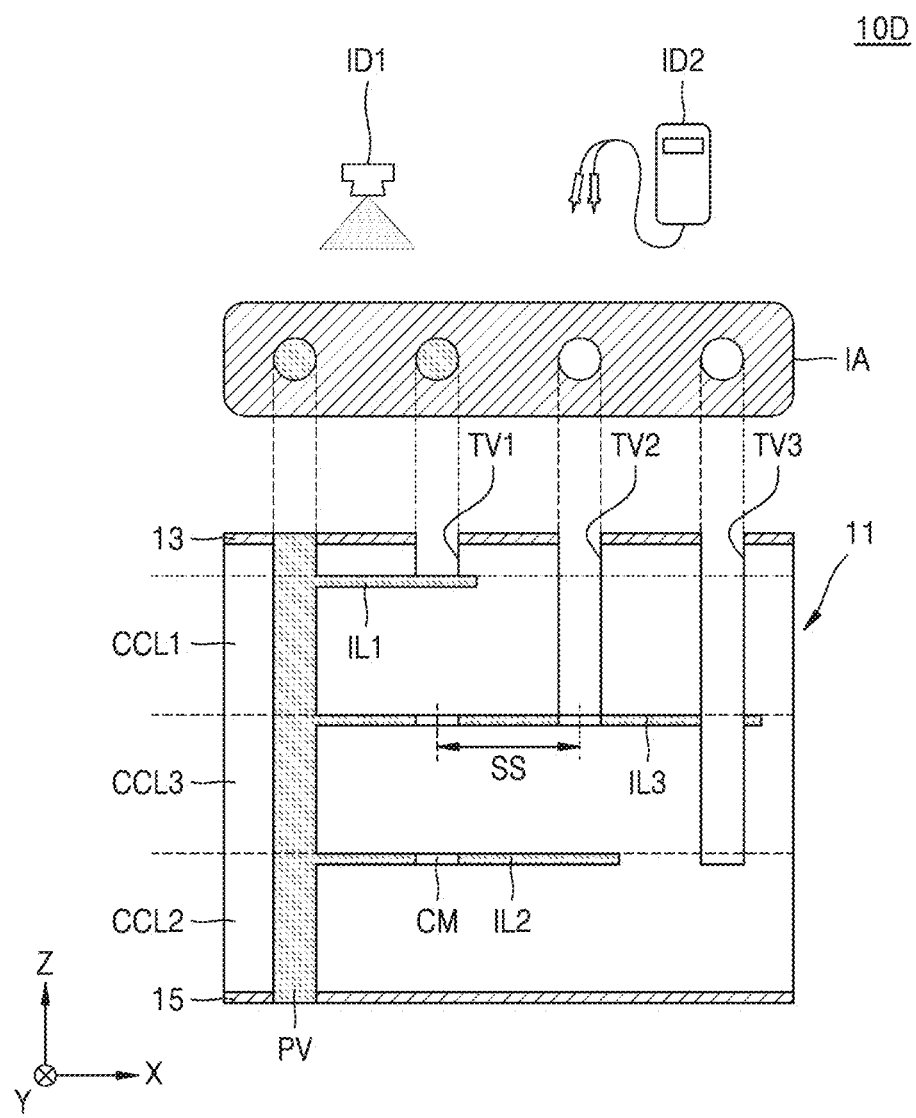

FIGS. 4A to 4C are a plan view and cross-sectional views illustrating PCBs 10 and 10D according to an example embodiment of the inventive concepts.

Referring to FIGS. 4A to 4C together, the PCB 10 includes a plurality of CCLs (e.g., CCL1, CCL2, and CCL3) and a plurality of mislamination identifying portions ILL IL2, and IL3.

A length 10X of the PCB 10 in the X direction may be defined as 60 mm, 80 mm, or 110 mm, and a length 10Y of the PCB 10 in the Y direction may be defined as 22 mm That is, the PCB 10 may be formed based on the M.2 standard, but the inventive concepts are not limited thereto.

The PCB 10 may include a body layer 11, an upper protective layer 13, and a lower protective layer 15. Wiring layers may be formed on the PCB 10, and the wiring layers on the PCB 10 may be electrically connected to a semiconductor package through a connection terminal. Also, the port 180 may be disposed on the PCB 10. The PCB 10 may be electrically connected to and mounted on a module board, a system board, a main board, etc. through the port 180.

Multiple wiring layers may be formed in the body layer 11 and may be electrically connected to a memory controller and a semiconductor package. The upper protective layer 13 and the lower protective layer 15 may function to protect the body layer 11, and may include, for example, solder resist.

In addition, the body layer 11 may be implemented generally by compressing a polymer material such as a thermosetting resin, an epoxy resin such as flame retardant 4 (FR-4), bismaleimide triazine (BT), or Ajinomoto build up film (ABF), or a phenol resin to a certain thickness to form a thin plate, applying a copper foil to the thin plate, and subsequently forming a wiring layer as a transmission path of an electrical signal through patterning. The thin plate on which the copper foil is formed may be referred to as a CCL.

For example, the PCB 10 according to some example embodiments of the inventive concepts may include the body layer 11 in which K (here, K is an integer of 2 or greater) CCLs are laminated in a vertical direction from the uppermost circuit layer (a first layer) to the lowermost circuit layer (a K-th layer). For convenience of description, three CCLs (e.g., CCL1, CCL2, and CCL3) are illustrated (here, K=3), but the inventive concepts are not limited thereto.

For example, three or more CCLs CCL1, CCL2, and CCL3 may be laminated using an insulator called prepreg, and three or more wiring layers may be formed according to the number of laminated CCLs CCL1, CCL2, and CCL3 to implement the PCB having multiple wirings. However, the inventive concepts are not limited to the structure or material of the PCB 10 described above.

The PCB 10, as a board on which a semiconductor package is mounted, includes an insulating layer and a wiring layer. The wiring layer includes a conductive trace formed in the insulating layer and a conductive via passing through the insulating layer and connected to the conductive trace.

The PCB 10 may include a memory controller area CA and first and second mounting areas MA1 and MA2 as two memory chip mounting areas. However, the number of memory chip mounting areas included in the PCB 10 is not limited thereto.

The first and second mounting areas MA1 and MA2 may be positioned on the same surface of the PCB 10, and the first mounting area MA1 may be positioned farther from the memory controller area CA than the second mounting area MA2. However, the arrangement of the first and second mounting areas MA1 and MA2 is not limited thereto.

Also, the PCB 10 may include a power supply area PA adjacent to the memory controller area CA. However, the arrangement of the power supply area PA is not limited thereto.

In addition, the PCB 10 according to some example embodiments of the inventive concepts may include a non-destructive testing area IA disposed in a dummy area. The non-destructive testing area IA may be disposed as an island apart from the wiring layer as an electrical signal transmission path.

In the non-destructive testing area IA, the mislamination identifying portions ILL IL2, and IL3 included in the CCLs CCL1, CCL2, and CCL3, respectively, may be arranged. The mislamination identifying portions ILL IL2, and IL3 each may be arranged to be apart from each other at the same distance in a Z direction.

The non-destructive testing area IA may include the through-via holes TV1, TV2, and TV3 exposing the mislamination identifying portions ILL IL2, and IL3, respectively, in the Z direction and arranged at a first interval SS and a probe via PV in contact with respective ends of the mislamination identifying portions ILL IL2, and IL3 on the same side and extending in the Z direction.

A diameter TVD of each of the through-via holes TV1, TV2, and TV3 may be about 200 μm to about 1000 μm, but is not limited thereto. In addition, a level of an upper surface of the probe via PV may be higher in the Z direction than a level of the wiring layer of the uppermost circuit layer (the first layer), so that the upper surface of the probe via PV may be exposed to the outside. That is, the upper surface of the probe via PV may not be covered with the upper protective layer 13. In some example embodiments, a lower surface of the probe via PV may be exposed to the outside. That is, the lower surface of the probe via PV may not be covered with the lower protective layer 15.

A length of the mislamination identifying portion IL3 positioned on, for example, the CCL CCL3 of a third layer, among CCLs of N layers (here, N is an integer of 1 to K), in the X direction may be greater than a length of the mislamination identifying portion IL2 positioned on the CCL CCL2 of a second layer in the X direction.

In some example embodiments, two copper foil removed areas CM may be disposed at the first interval SS in the mislamination identifying portion IL3 in the third-layer CCL CCL3. That is, from the uppermost circuit layer (the first layer) to the lowermost circuit layer (the K-th layer), a length of each of the mislamination identifying portions ILL IL2, and IL3 may gradually increase in the X direction, and the number of copper foil removed areas CM in each of the mislamination identifying portions ILL IL2, and IL3 may gradually increase.

In some example embodiments, a third through-via hole TV3 exposing the mislamination identifying portion IL3 positioned in the CCL CCL3 of the third layer may be apart from the probe via PV by three times the first interval SS.

Here, the copper foil removed areas CM of the mislamination identifying portions ILL IL2, and IL3 do not reflect light and do not conduct electricity, and the other regions of the mislamination identifying portions ILL IL2, and IL3, excluding the copper foil removed areas CM, may include a metal such as copper that may reflect light and conduct electricity.

Accordingly, when tested by an optical inspection device ID1, the PCB 10D in which light is not reflected from at least one of the through-via holes TV1, TV2, and TV3 may be determined to have a mislamination defect in the CCLs CCL1, CCL2, and CCL3. In addition, when tested by an electrical inspection device ID2, the PCB 10D in which electricity is not conducted between at least one of the mislamination identifying portions ILL IL2, and IL3 exposed from the through-via holes TV1, TV2, and TV3 and the probe via PV may be determined to have a mislamination defect in the CCLs CCL1, CCL2, and CCL3.

Thus, According to some example embodiments of the inventive concepts, mislamination defects of the CCLs CCL1, CCL2, and CCL3 that may occur during a manufacturing process of the PCB 10 may be detected by non-destructive testing using the optical inspection device ID1 and/or electrical inspection device ID2, and thus, high product reliability and high production efficiency may be provided.

Figure 5A:
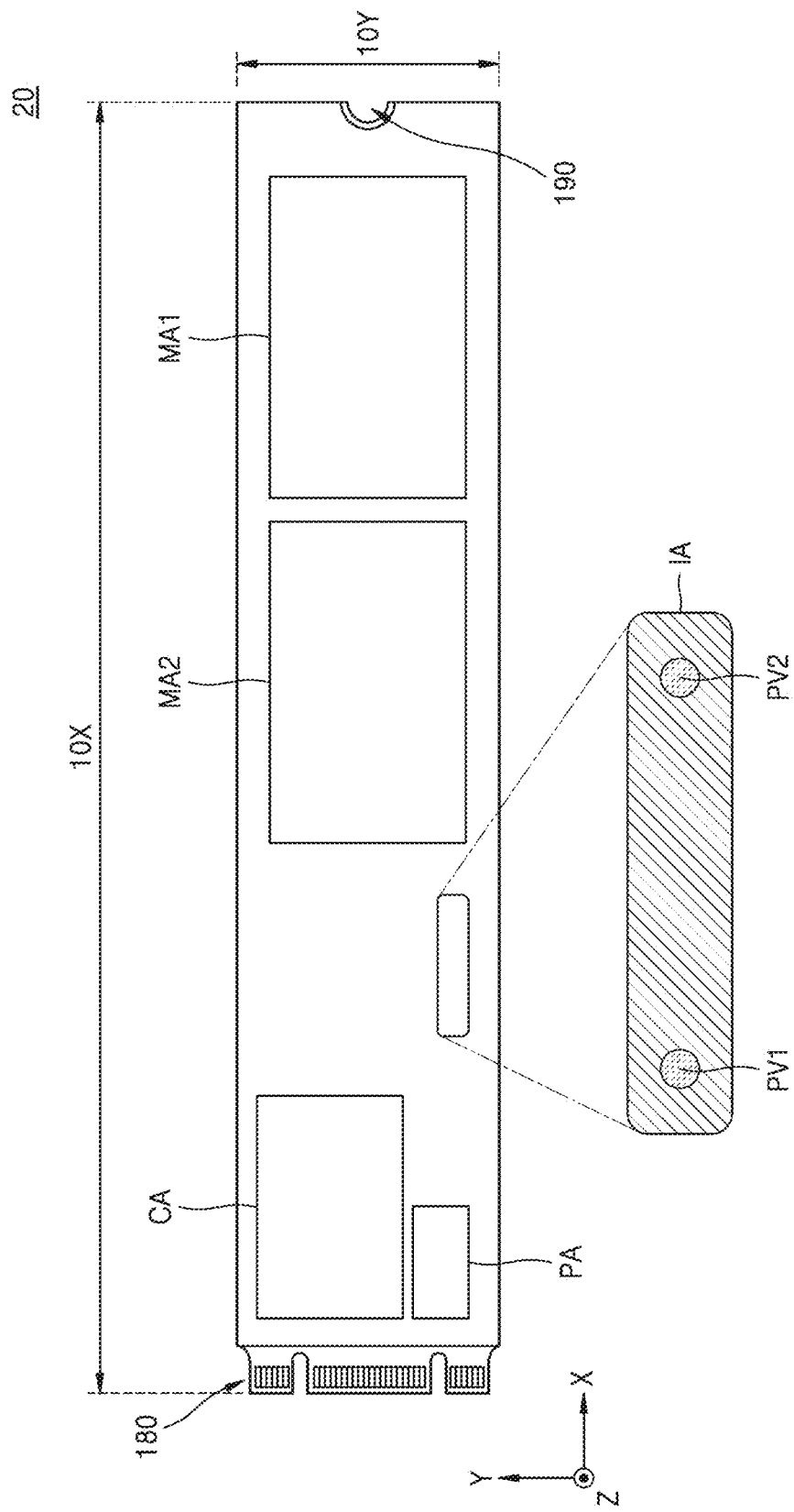
FIGS. 5A to 5C are a plan view and cross-sectional views illustrating PCBs according to other example embodiments of the inventive concepts.
Figure 5B:
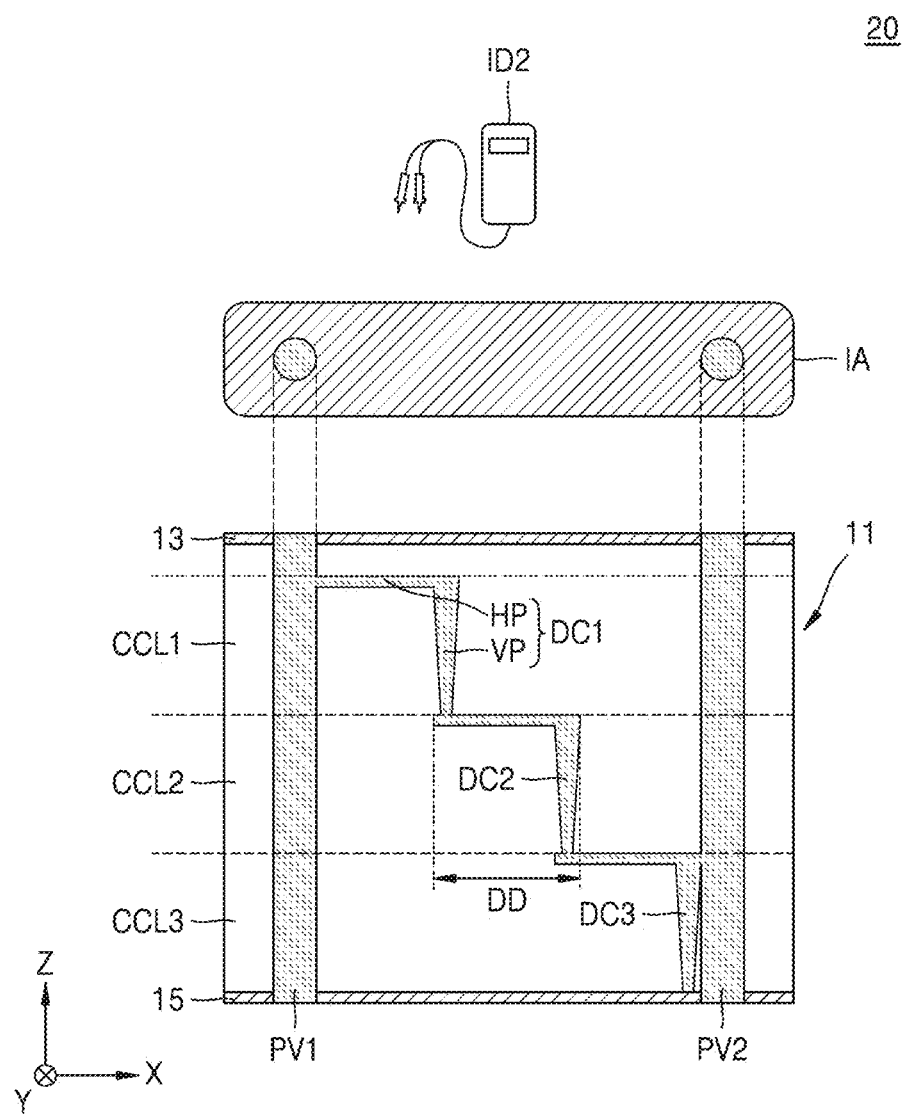
Figure 5C:
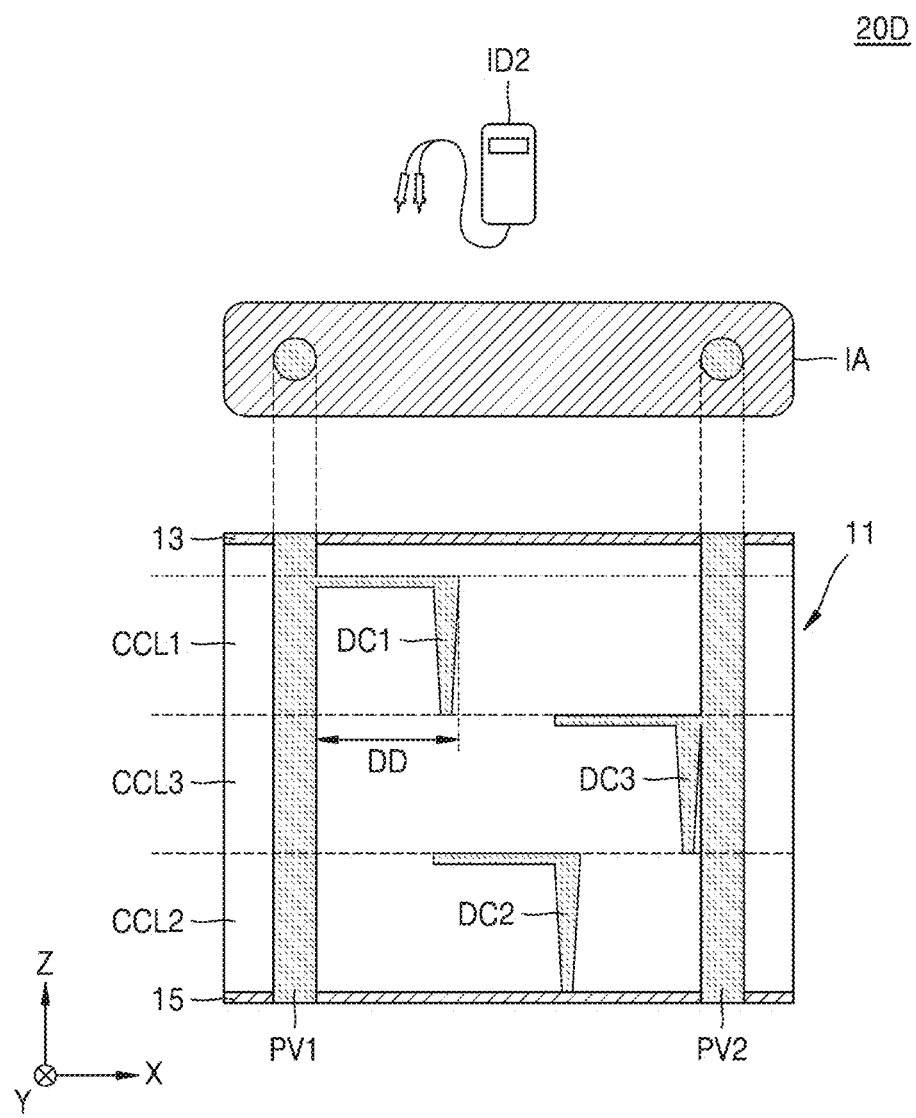

FIGS. 5A to 5C are a plan view and cross-sectional views illustrating PCBs 20 and 20D according to other example embodiments of the inventive concepts.

Most of the components constituting the PCB 20 described below and materials constituting the components are substantially the same as or similar to the PCB 10 described above with reference to FIGS. 4A to 4C above. Therefore, for convenience of description, differences from the PCB 10 described above are mainly described.

Referring to FIGS. 5A to 5C together, the PCB 20 includes a plurality of CCLs CCL1, CCL2, and CCL3 and a plurality of daisy chains DC1, DC2, and DC3.

The PCB 20 according to some example embodiments of the inventive concepts may include a body 11 in which K (here, K is an integer of 2 or greater) CCLs are vertically laminated from the uppermost circuit layer (a first layer) to the lowermost circuit layer (a K-th layer). For convenience of description, three CCLs CCL1, CCL2, and CCL3 are illustrated (here, K=3), but the inventive concepts are not limited thereto.

The PCB 20 according to some example embodiments of the inventive concepts may include a non-destructive testing area IA positioned in a dummy area. The non-destructive testing area IA may be positioned as an island apart from a wiring layer as an electrical signal transmission path.

In the non-destructive testing area IA, daisy chains DC1, DC2, and DC3 may be positioned in the CCLs CCL1, CCL2, and CCL3, respectively, and each may include a horizontal extension portion HP extending in the X direction on an upper surface of each of the CCLs CCL1, CCL2, and CCL3 by a first length DD and a vertical extension portion VP extending in the Z direction from an end of each of the horizontal extension portions HP through a corresponding each of the CCLs CCL1, CCL2, and CCL3. Here, the daisy chains DC1, DC2, and DC3 may be arranged in a continuous step shape.

The non-destructive testing area IA may include a first probe via PV1 providing a reference position of the daisy chains DC1, DC2, and DC3 and extending in the Z direction through the PCB 20.

Among the CCLs of N layers (here, N is an integer of 1 to K), for example, the daisy chain DC2 positioned in the CCL CCL2 of the second layer may be apart from the first probe via PV1 by the first length DD.

In some example embodiments, the daisy chain DC1 positioned in the CCL CCL1 of the uppermost circuit layer (the first layer) may be in direct contact with the first probe via PV1 positioned at one end of the non-destructive testing area IA.

In some example embodiments, the daisy chain DC3 positioned in the CCL CCL3 of the lowermost circuit layer (the K-th layer) (i.e., the third layer) may be in direct contact with a second probe via PV2 disposed at the other end (e.g., an opposite end) of the non-destructive testing area IA.

A level of an upper surface of each of the first and second probe vias PV1 and PV2 may be higher in the Z direction than a level of the wiring layer of the uppermost circuit layer (the first layer), so that the respective upper surfaces of the first and second probe vias PV1 and PV2 may be exposed to the outside. That is, the respective upper surfaces of the first and second probe vias PV1 and PV2 may not be covered with the upper protective layer 13. In some example embodiments, respective lower surfaces of the first and second probe vias PV1 and PV2 may be exposed to the outside. That is, the respective lower surfaces of the first and second probe vias PV1 and PV2 may not be covered with the lower protective layer 15.

When inspected by the electrical inspection device ID2, the PCB 20D, in which electricity is not conducted between the first probe via PV1 and the second probe via PV2, may be determined as having a mislamination defect in the CCLs CCL1, CCL2, and CCL3.

Thus, according to some example embodiments of the inventive concepts, mislamination defects of the CCLs CCL1, CCL2, and CCL3 that may occur during a manufacturing process of the PCB 20 may be detected by non-destructive testing using the electrical inspection device ID2, and thus, high product reliability and high production efficiency may be provided.

Figure 6A:
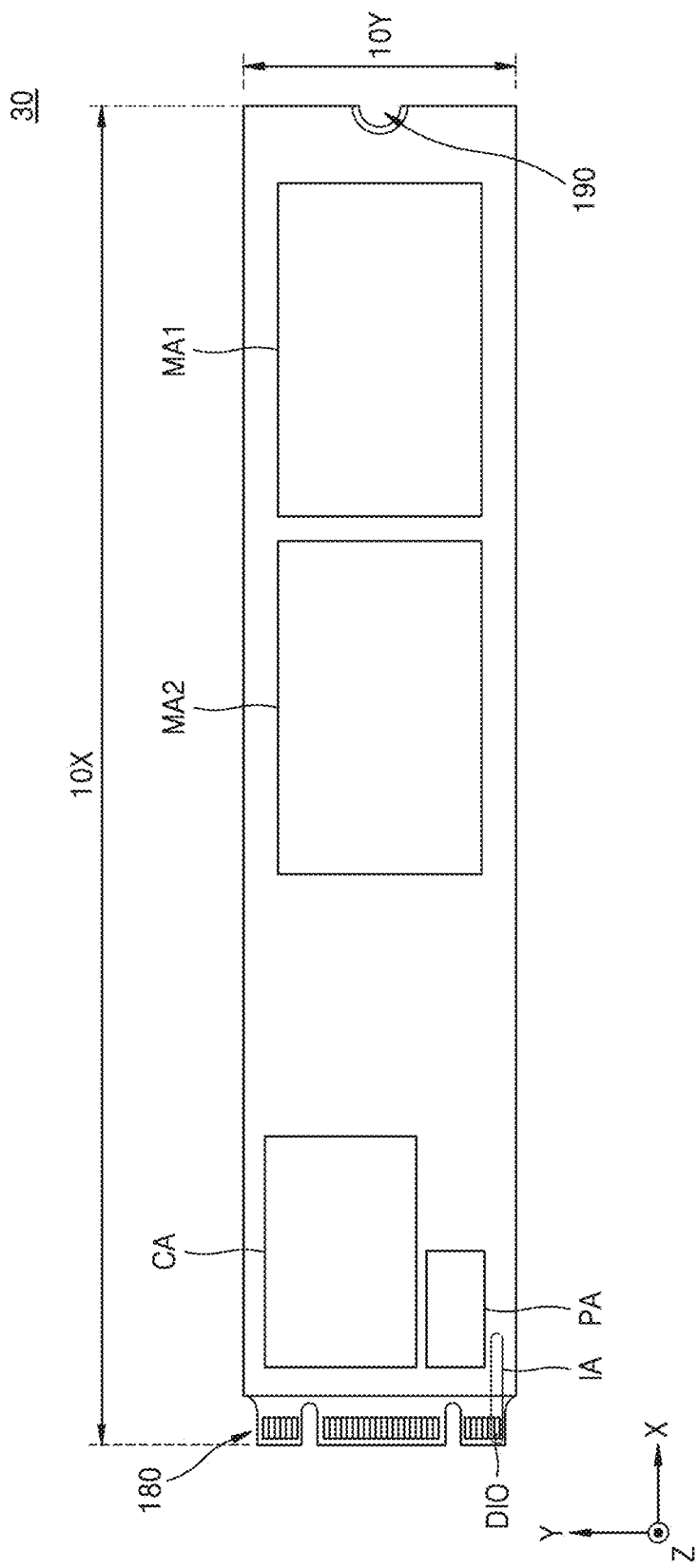
Figure 6B:
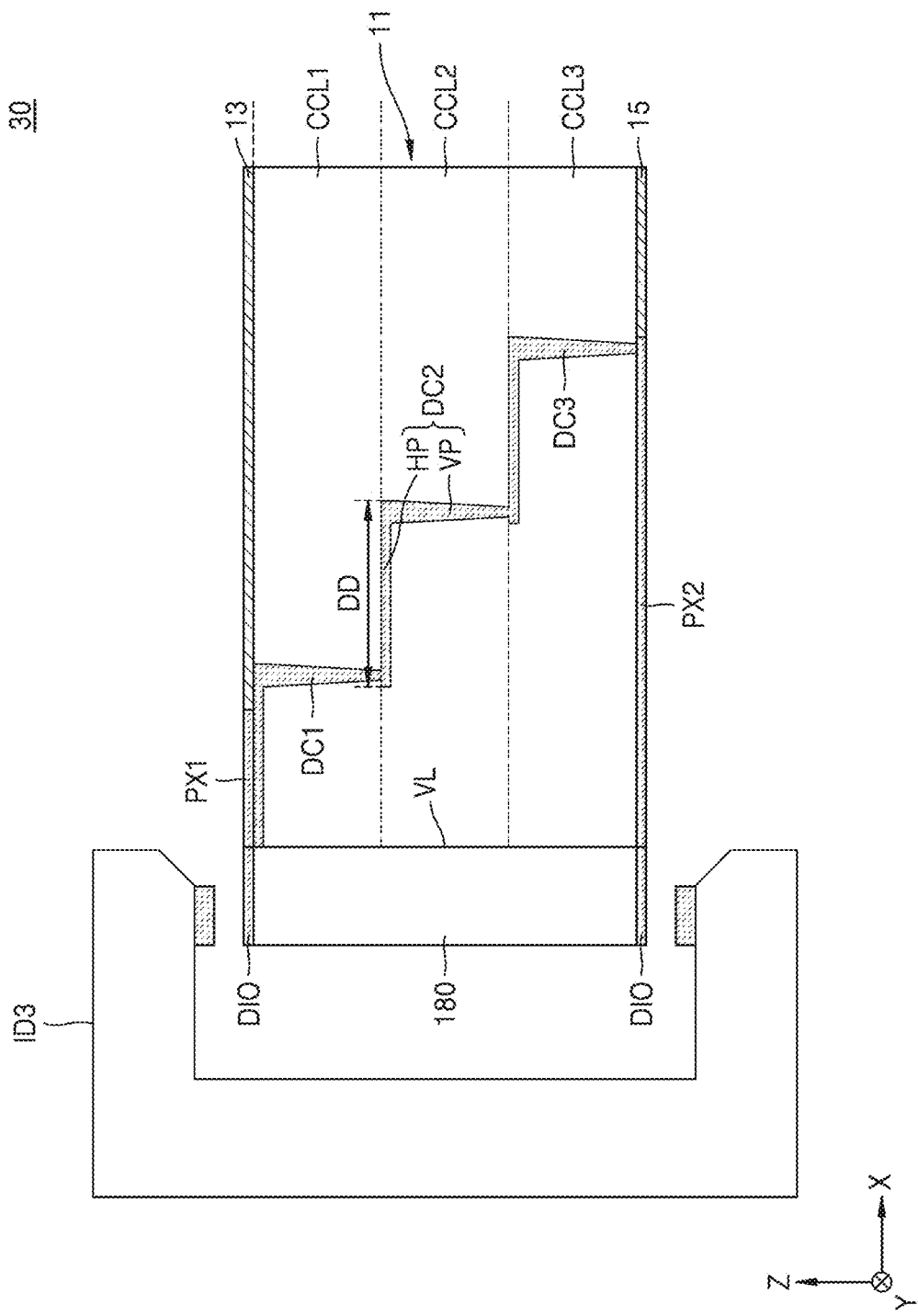

FIGS. 6A to 6C are a plan view and cross-sectional views illustrating PCBs 30 and 30D according to other example embodiments of the inventive concepts.

Most of the components constituting the PCBs 30 and 30D described below and materials constituting the components are substantially the same as or similar to the PCBs 10 and 10D described above with reference to FIGS. 4A to 4C above. Therefore, for convenience of description, differences from the PCBs 10 and 10D described above are mainly described.

Referring to FIGS. 6A to 6C together, the PCB 30 includes a plurality of CCLs CCL1, CCL2, and CCL3 and a plurality of daisy chains DC1, DC2, and DC3.

The PCB 30 according to some example embodiments of the inventive concepts may include a body 11 in which K (here, K is an integer of 2 or greater) CCLs are vertically laminated from the uppermost circuit layer (a first layer) to the lowermost circuit layer (a K-th layer). For convenience of description, three CCLs CCL1, CCL2, and CCL3 are illustrated (here, K=3), but the inventive concepts are not limited thereto.

The PCB 30 according to some example embodiments of the inventive concepts may include a non-destructive testing area IA positioned in a dummy area. The non-destructive testing area IA may be positioned as an island apart from a wiring layer as an electrical signal transmission path.

In the non-destructive testing area IA, the daisy chains DC1, DC2, and DC3 may be positioned in the CCLs CCL1, CCL2, and CCL3, respectively, and each may include a horizontal extension portion HP extending in the X direction on an upper surface of each of the CCLs CCL1, CCL2, and CCL3 by a first length DD and a vertical extension portion VP extending in the Z direction from an end of each of the horizontal extension portions HP through the CCLs CCL1, CCL2, and CCL3. Here, the daisy chains DC1, DC2, and DC3 may be arranged in a continuous step shape.

The non-destructive testing area IA may include a reference line VL providing reference position of the daisy chains DC1, DC2, and DC3 and extending in the Z-direction. Among the N (here, N is an integer of 1 to K)-layer CCLs, for example, the daisy chain DC2 positioned in the second-layer CCL CCL2 may be apart from the reference line VL by twice the first length DD.

In some example embodiments, the daisy chain DC1 positioned in the CCL CCL1 of the uppermost circuit layer (the first layer) may be in direct contact with an upper tab of a dummy terminal DIO positioned at the port 180 of the PCB 30 through a first extension line PX1.

In some example embodiments, the daisy chain DC3 positioned in the CCL CCL3 of the lowermost circuit layer (the K-th layer) may be in direct contact with a lower tab of the dummy terminal DIO positioned at the port 180 of the PCB 30 through a second extension line PX2.

In some example embodiments, a level of an upper surface of the first extension line PX1 may be substantially the same as a level of an upper surface of the upper protective layer 13, and a level of a lower surface of the second extension line PX2 may be substantially the same as a level of a lower surface of the lower protective layer 15. That is, the upper surface of the first extension line PX1 and the lower surface of the second extension line PX2 may be exposed to the outside.

When inspected by a port inspection device ID3, the PCB 30D, in which electricity is not conducted between the upper tab and the lower tab of the dummy terminal DIO disposed at the port 180, may be determined as having a mislamination defect in the CCLs CCL1, CCL2, and CCL3.

Thus, according to some example embodiments of the inventive concepts, mislamination defects of the CCLs CCL1, CCL2, and CCL3 that may occur during a manufacturing process of the PCB 30 may be detected by non-destructive testing using the port inspection device ID3, and thus, high product reliability and high production efficiency may be provided.

Figure 7:
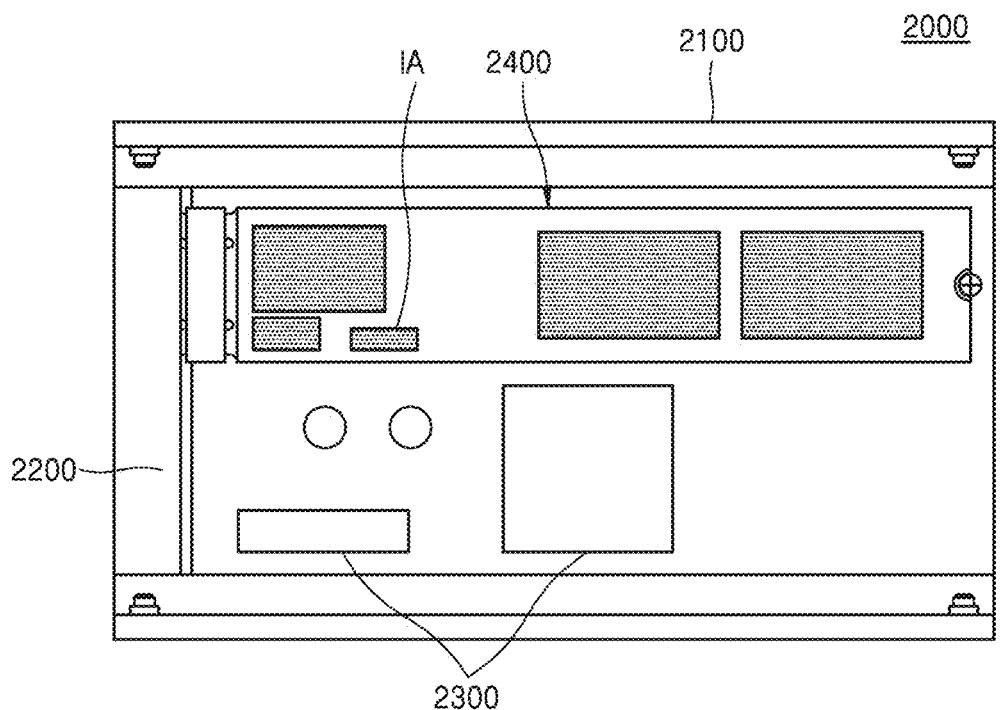
FIG. 7 is a schematic plan view illustrating an electronic device including a storage device according to an example embodiment of the inventive concepts.

FIG. 7 is a schematic plan view illustrating an electronic device 2000 including a storage device 2400 according to an example embodiment of the inventive concepts.

Referring to FIG. 7, the electronic device 2000 may include a main board 2200 inside a housing 2100, and the main board 2200 may include the storage device 2400 and an electrical element in a peripheral region surrounding the storage device 2400, for example, a passive element 2300 such as a capacitor, an inductor, or a resistor.

The electronic device 2000 may include the passive element 2300 to smoothly transmit a signal to the storage device 2400. The resistor reduces noise of a signal wave, and the capacitor operates as a decoupling capacitor.

The storage device 2400 may be implemented using any one of the PCBs 10, 20, and 30 of the example embodiments of the inventive concepts described above with reference to FIGS. 4A to 6C and may be reconfigured to have a memory capacity desired by the electronic device 2000.

A computer bus interface provided in the electronic device 2000 is similar to that of FIG. 8 to be described below. Selection of which of interfaces is to be supported depends on the corresponding electronic device 2000 and the equipment according to a support stage of the electronic device 2000 or a type of the equipment desired.

Figure 8:
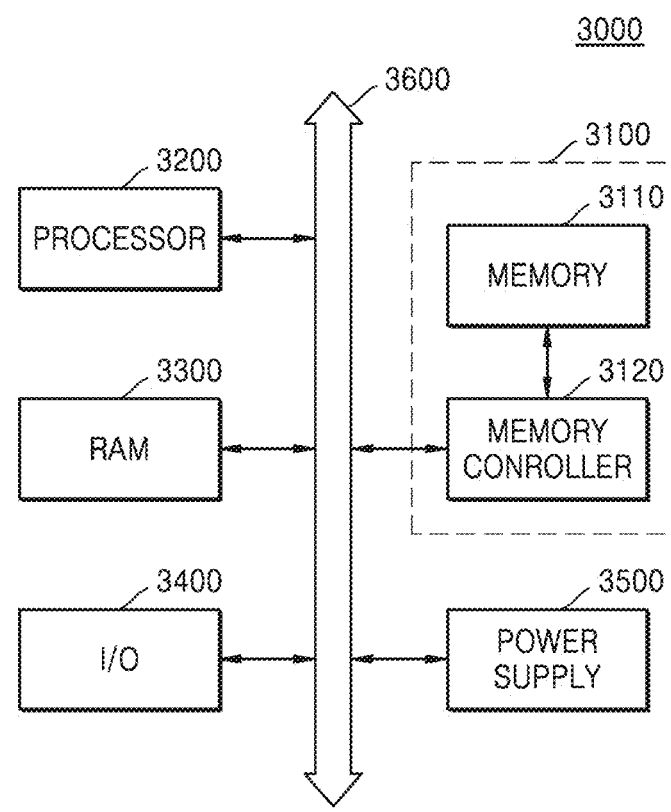
FIG. 8 is a block diagram illustrating a computing system including a storage device according to an example embodiment of the inventive concepts.

FIG. 8 is a block diagram illustrating a computing system 3000 including a storage device 3100 according to an example embodiment of the inventive concepts.

Referring to FIG. 8, the computing system 3000 may include the storage device 3100, a processor 3200, RAM 3300, an input/output device (I/O) 3400, and a power supply 3500.

Although not shown, the computing system 3000 may further include a port for communicating with a video card, a sound card, a memory card, a USB device, or the like, or communicating with other electronic devices. The computing system 3000 may be implemented as a stationary electronic device such as a personal computer and a server, or as a mobile electronic device such as a mobile phone, a digital camera, a portable terminal, or a notebook computer.

The processor 3200 may perform a specific calculation or task. In some example embodiments, the processor 3200 may be a microprocessor or a central processing unit (CPU). The processor 3200 may perform communication with the RAM 3300, the I/O 3400, and the storage device 3100 via a bus 3600 such as an address bus, a control bus, and a data bus. The processor 3200 may also be connected to an expansion bus such as a peripheral component interconnect (PCI) bus.

The storage device 3100 may be implemented using any one of the PCBs 10, 20, and 30 of the example embodiments of the inventive concepts described above with reference to FIGS. 4A to 6C and may be reconfigured to have a memory capacity desired by the computing system 3000.

The RAM 3300 may store data desired for the operation of the computing system 3000. For example, the RAM 3300 may include DRAM, mobile DRAM, SRAM, PRAM, FRAM, RRAM, and/or MRAM.

The I/O 3400 may include an input unit such as a keyboard, a keypad, a mouse, and a touch pad, and an output unit such as a printer, a display, and a touch screen.

The power supply 3500 may supply operating power for the operation of the computing system 3000.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the following claims.

What is claimed is:

1. A printed circuit board in which K (K is an integer of 2 or greater) copper clad laminates (CCLs) are laminated vertically from an uppermost circuit layer (a first layer) to a lowermost circuit layer (a K-th layer), the printed circuit board comprising:
   a non-destructive testing area;
   mislamination identifying portions in the non-destructive testing area, the mislamination identifying portions being in the CCLs, respectively;
   through-via holes vertically exposing the mislamination identifying portions, respectively, in the non-destructive testing area, the through-via holes being spaced apart from each other by a first interval; and
   a probe via extending vertically and being in contact with an end portion of each of the mislamination identifying portions on a same side,
   wherein a length of the mislamination identifying portion in an N-th (N is an integer of 1 to K) layer CCL in a horizontal direction is longer than a length of the mislamination identifying portion in an (N−1)-th layer CCL in the horizontal direction, and
   (N−1) copper foil removed areas are arranged at the first interval in the mislamination identifying portion positioned in the N-th layer CCL.

2. The printed circuit board of claim 1, wherein, from among the through-via holes, an N-th through-via hole exposing the mislamination identifying portion in the N-th layer CCL is apart from the probe via by N times the first interval.

3. The printed circuit board of claim 1, wherein a diameter of each of the through-via holes ranges from 200 m to 1000 □m.

4. The printed circuit board of claim 1, wherein each of the mislamination identifying portions includes a copper foil removed area that does not reflect light and does not conduct electricity.

5. The printed circuit board of claim 4, wherein the printed circuit board is defined as having a mislamination defect when light is not reflected from at least one of the mislamination identifying portions exposed by the through-via holes.

6. The printed circuit board of claim 4, wherein the printed circuit board is defined as having a mislamination defect when electricity is not conducted between at least one of the mislamination identifying portions exposed by the through-via holes and the probe via.

7. The printed circuit board of claim 1, wherein the mislamination identifying portions are apart from each other vertically at a same interval.

8. The printed circuit board of claim 1, wherein from the uppermost circuit layer (the first layer) to the lowermost circuit layer (the K-th layer),
   a length of each of the mislamination identifying portions gradually increases in the horizontal direction, and
   a number of copper foil removed areas in each of the mislamination identifying portions gradually increases.

9. The printed circuit board of claim 1, wherein the non-destructive testing area is an island in a dummy region that is spaced apart from wiring layers including the lowermost circuit layer (the K-th layer) to the uppermost circuit layer (the first layer).

10. The printed circuit board of claim 1, wherein an upper surface and a lower surface of the probe via are exposed.

11. A storage device comprising:
a printed circuit board;
at least one semiconductor package on the printed circuit board, and including a plurality of nonvolatile memory chips; and
a memory controller on the printed circuit board and configured to perform a write and read operation on the at least one semiconductor package,
wherein the printed circuit board, in which a plurality of copper clad laminates (CCLs) are laminated vertically from an uppermost circuit layer to a lowermost circuit layer, includes,
mislamination identifying portions in a non-destructive testing area, the mislamination identifying portions being in the CCLs, respectively,
through-via holes vertically exposing the mislamination identifying portions, respectively, in the non-destructive testing area, the through-via holes being spaced apart from each other by a first interval, and
a probe via extending vertically and being in contact with an end portion of each of the mislamination identifying portions on a same side, and
wherein, from the uppermost circuit layer to the lowermost circuit layer, lengths of the mislamination identifying portions gradually increase in a horizontal direction and a number of copper foil removed areas of the mislamination identifying portions gradually increases.

12. The storage device of claim 11, wherein the printed circuit board is determined as having a mislamination defect when light is not reflected from at least one of the mislamination identifying portions exposed from the through-via holes or electricity is not conducted between at least one of the mislamination identifying portions exposed from the through-via holes and the probe via.

* * * * *